(12) United States Patent
Martin et al.

(10) Patent No.: US 12,237,447 B2
(45) Date of Patent: Feb. 25, 2025

(54) QUANTUM DOT LAYER FOR COLOR, MICRO-LED DISPLAYS

(71) Applicant: TECTUS CORPORATION, Cupertino, CA (US)

(72) Inventors: Paul S. Martin, Saratoga, CA (US); Michael W. Wiemer, Saratoga, CA (US)

(73) Assignee: TECTUS CORPORATION, Cupertino, CA (US)

( * ) Notice: Subject to any disclaimer, the term of this patent is extended or adjusted under 35 U.S.C. 154(b) by 0 days.

(21) Appl. No.: 18/409,727

(22) Filed: Jan. 10, 2024

(65) Prior Publication Data

US 2024/0243235 A1 Jul. 18, 2024

Related U.S. Application Data

(60) Provisional application No. 63/438,865, filed on Jan. 13, 2023.

(51) Int. Cl.
| | |
|---|---|
| *H01L 33/50* | (2010.01) |
| *H01L 25/16* | (2023.01) |
| *H01L 33/32* | (2010.01) |
| *H01L 33/58* | (2010.01) |

(52) U.S. Cl.
CPC .......... *H01L 33/502* (2013.01); *H01L 25/167* (2013.01); *H01L 33/32* (2013.01); *H01L 33/58* (2013.01)

(58) Field of Classification Search
CPC ............................ H01L 33/502; H01L 25/167
See application file for complete search history.

(56) References Cited

U.S. PATENT DOCUMENTS

| | | | |
|---|---|---|---|
| 11,121,289 B2 | 9/2021 | Martin | |
| 11,294,219 B2 | 4/2022 | Jiang | |
| 11,296,294 B2 | 4/2022 | Jang | |
| 11,637,260 B2 | 4/2023 | You | |
| 2020/0350471 A1 | 11/2020 | Onuma | |
| 2021/0351239 A1* | 11/2021 | Bae ...................... H10K 50/856 |
| 2022/0020943 A1* | 1/2022 | Chung ................. H10K 59/353 |
| 2023/0223503 A1* | 7/2023 | Oohata ................. H01L 33/502 |
| | | | 257/91 |

\* cited by examiner

*Primary Examiner* — Jay C Chang
*Assistant Examiner* — Mikka Liu

(57) ABSTRACT

Color conversion layers, methods of making color conversion layers, monolithic color, micro-light-emitting diode displays and methods of making monolithic, color, micro-light-emitting diode displays are disclosed.

29 Claims, 9 Drawing Sheets

QUANTUM DOT LAYER FOR COLOR, MICRO-LED DISPLAYS

This application claims the benefit under 35 U.S.C. § 119(e) of U.S. Provisional Application No. 63/438,865, filed on Jan. 13, 2023, which is incorporated by reference in its entirety.

FIELD

The disclosure relates to monolithic, color, micro-LED displays and methods of making monolithic, color, micro-LED displays.

BACKGROUND

Demand for color displays, for televisions, tablets, cell phones and future applications such as augmented reality glasses, is insatiable. In particular, there is high demand for small, bright and efficient color displays, better than those that exist today. Hence there is a great need for new display structures and methods of manufacturing them.

DETAILED DESCRIPTION

A monolithic, full-color, micro-LED display may be fabricated by bonding a color conversion layer to a monochrome display. The color conversion layer includes pixels containing quantum dots which are tuned to appropriate wavelengths to create pixels of different colors. If, for example, the monochrome display emits blue light, then green pixels may be created by illuminating quantum dots tuned to convert blue light into green light. Similarly, red pixels may be created by illuminating quantum dots tuned to convert blue light into red light. A challenge lies in creating a structure in which green dots are over some blue pixels and red dots are over adjacent blue pixels. This is especially difficult at the 0.5 µm to 5 µm pixel sizes (pixel diameter) needed for new micro-display applications. Furthermore, such a process must be performed after a monochrome blue display wafer leaves a wafer processing facility, because quantum dots are not compatible with high performance semiconductor fabrication equipment and facilities.

Figure 1:
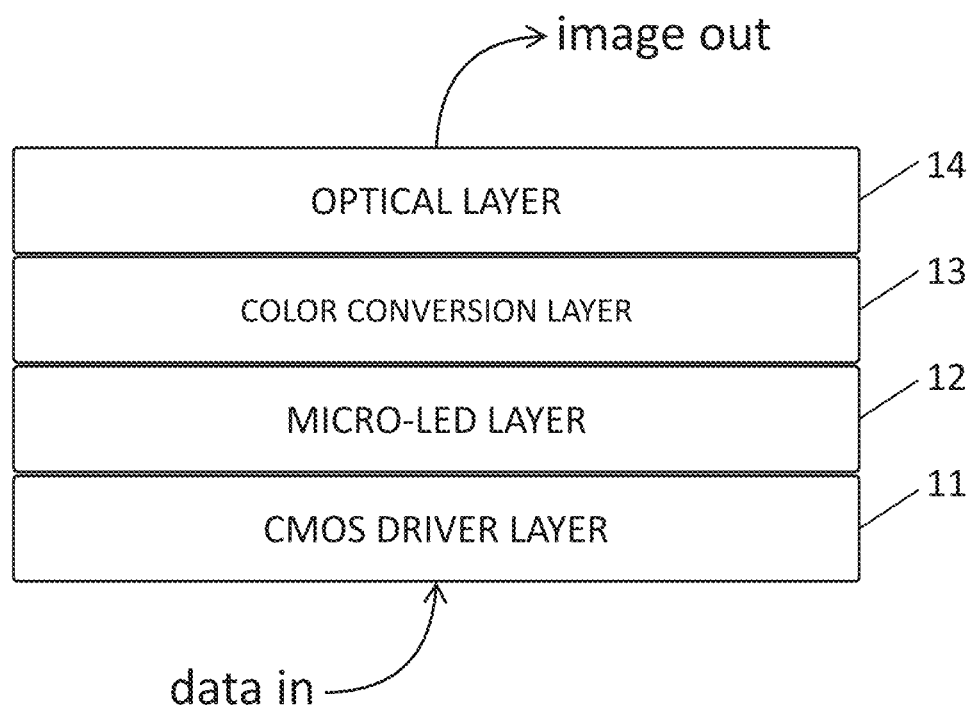
FIG. 1 shows a schematic, cross-sectional view of a CMOS driver layer, micro-LED layer, color conversion layer, and optical layer in a color, micro-LED display.

FIG. 1 shows a schematic, cross-sectional view of an integrated CMOS driver layer 11, micro-LED layer 12, color conversion layer 13, and optical layer 14 in a color, micro-LED display. Briefly, the CMOS driver layer 11 takes digital data as its input and applies electric current to turn micro-LED pixels in micro-LED layer 12 on and off at times and brightness levels encoded by the data. The micro-LED layer 12 contains micro-LEDs which emit light when driven by an electric current. Micro-LEDs are defined in the micro-LED layer 12 by various semiconductor wafer processing techniques, but all micro-LEDs emit light within the same wavelength range (i.e. at the same color) and have the same semiconductor structure. For example, a micro-LED layer 12 can be formed from GaN and contain InGaN quantum wells. The color conversion layer 13, as its name implies, changes the wavelength of light emitted by at least some of the micro-LEDs. For some micro-LEDs, the blue light is transmitted through a transparent material of a pixel overlying the micro-LED. Finally, the optical layer 14 can contain micro-lenses which focus light emitted from the display for viewing (e.g. in a phone, tablet or television), or to mirrors, lenses and/or other optical components to form images in, for example, augmented reality glasses. A passivation layer can be disposed between the color conversion layer and the optical layer.

Figure 2:
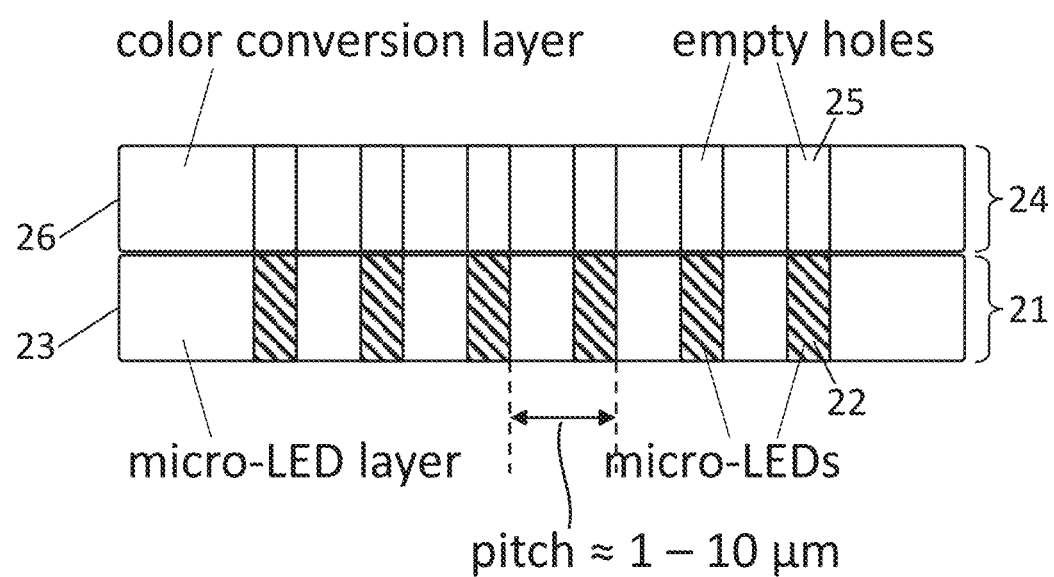
FIG. 2 shows a schematic, cross-sectional view of micro-LED and color conversion layers in a color, micro-LED display.

FIG. 2 shows a schematic, cross-sectional view of micro-LED layer 21 and a color conversion 24 layer in a color, micro-LED display. The CMOS driver and optical layers are omitted for clarity. In this view, pixels are defined in the substrate 23 of micro-LED layer 21 and in the color conversion layer 24. The color conversion layer 24 shown in FIG. 2 contains empty cavities 25 in a substrate 26. The substrate 26 may be made from aluminum or benzocyclobutene, for example. Each cavity 25 is aligned with a micro-LED pixel 22 in the micro-LED layer 21. The color conversion layer 24 can be bonded to the micro-LED layer 21 by a wafer-to-wafer bonding process. The CMOS driver layer can be bonded to the micro-LED layer 21 before the color conversion layer 24 is bonded to the micro-LED layer 21. The optical layer can be bonded to the color conversion layer 24 after the color conversion layer 24 is bonded to the micro-LED layer 21.

Figure 9:
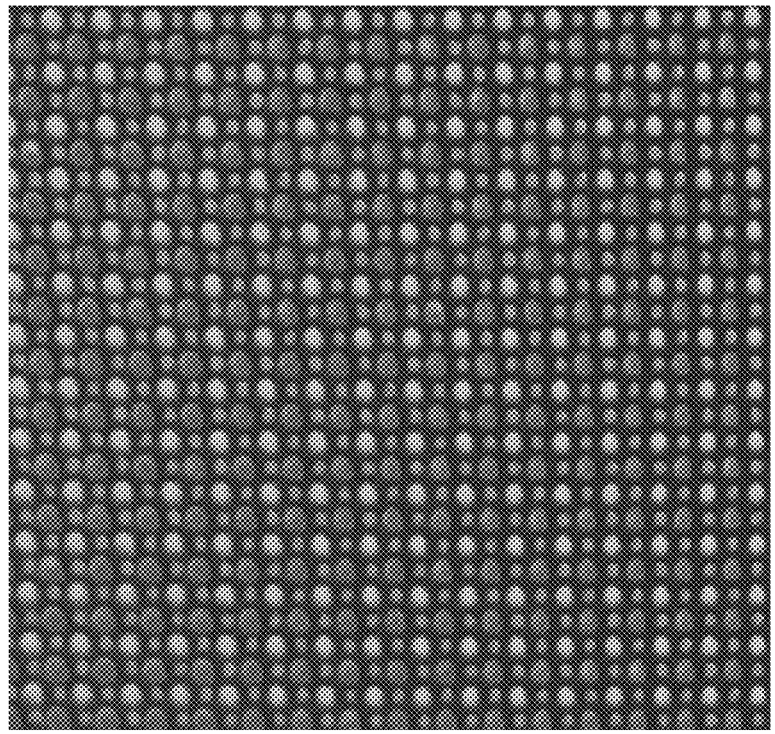
FIG. 9 is a photograph showing a plan view of a color conversion layer provided by the present disclosure comprising an array of blue (large diameter, dark gray), red (small diameter, medium gray), and green (medium diameter, light gray) pixels.

A pixel can be adjacent other pixels. An adjacent pixel refers to a pixel that is nearest a reference pixel compared to other pixels. In general pixels of a display will be organized in a regular array as shown, for example, in FIG. 9. As shown in FIG. 9, two blue pixels and two green pixels are adjacent each red pixel: four red pixels are adjacent each blue pixel: four red pixels are adjacent each green pixel. The center-to-center distance between adjacent pixels is referred to as the pixel pitch. Adjacent pixels are separated by a gap distance which refers to the distance between the edge of a reference pixel and the nearest edge of an adjacent pixel.

Referring to FIG. 2, a micro-LED pixel 22 and a color conversion pixel 25 can have a pitch, or distance from the center of one pixel to the center of an adjacent pixel, for example, of less than 5 µm, such as from 1 µm to 5 µm. The diameter of a pixel can be, for example, less than 0.5 µm, such as from 0.5 µm to 5 µm. The distance between the edge of a pixel and the closest edge of an adjacent pixel, i.e., gap distance, can be, for example, less than 10 µm, such as from 0.5 µm to 10 µm, or from 0.5 µm to 5 µm. A micro-LED pixel and an overlying color-conversion pixel can have the same pitch, diameter, and gap distance. A color conversion pixel can have a depth or thickness that is greater than the pixel diameter, 2 times greater than the pixel diameter, or 5 times greater than the pixel diameter. A color conversion pixel can have a depth or thickness, for example, from 0.5 µm to 5 µm, or from 1 µm to 5 µm. A color conversion pixel can have a height/diameter ratio, for example, greater than 1, greater than 1.5, or greater than 2. A color conversion pixel can have a height/diameter ratio, for example, from 1 to 5, from 1 to 3, from 2 to 5, or from 3 to 5. The height/diameter ratio refers to the ratio of the height or depth of a pixel to the diameter of the pixel. For example, a pixel having a height or depth of 3 µm and a diameter of 1 µm has a height/diameter ratio of 3 and a pixel having a height or depth of 2 µm and a diameter of 0.5 µm has a height/diameter ratio of 4.

An array of color conversion pixels can be characterized by, for example, a diameter from 0.5 µm to 5 µm: a pitch from 0.5 µm to 5 µm: a gap distance from 0.5 µm to 5 µm; and a height/diameter ratio from 2 to 5.

For example, an array of color conversion pixels can be characterized by a gap distance between adjacent color-conversion pixels that is less than 1 times the pitch, less than 0.5 times the pitch, or less than 0.3 times the pitch. For example, an array of color conversion pixels can be characterized by a gap distance between adjacent color-conversion pixels that is less than a pixel diameter.

A color-conversion pixel provided by the present disclosure can comprise a plurality of quantum dots.

A color-conversion pixel provided by the present disclosure can comprise a high density of quantum dots. For example, a color-conversion pixel can comprise from 10 vol % to 70 vol % quantum dots, where vol % is based on the total volume of the color-conversion pixel.

The plurality of quantum dots within a color-conversion pixel can be randomly packed or packed in a regular lattice such as a cubic lattice, which in addition to simple cubic, includes bcc and fcc packing geometries, a tetrahedral lattice, or a hexagonal system including hcp. While bcc and fcc structures can be regarded as interpenetrating cases of simple cubic, they are mentioned here to be inclusive of the case when the quantum dots are not all the same, particularly the case where the core-shell structures are the same, but the ligand structures differ. For example, a color-conversion pixel can comprise quantum dots having two or more different ligand structures, where one ligand structure can be configured, for example, to interact with the wall of the color-conversion pixel and another ligand structure can be configured, for example, to optimize quantum dot function.

Quantum dots are semiconductor materials having a size, composition, and structure in which the electrical and optical characteristics differ from the bulk properties due to quantum confinement effects. Fluorescence of quantum dots results from the excitation of a valence electron by light absorption, followed by the emission at a lower energy wavelength as the excited electrons return to the ground state. Quantum confinement causes the energy difference between the valence and conduction bands to change depending on the size, composition, and structure of a quantum dot. For example, the larger the quantum dot, the lower the energy of its fluorescence spectrum. The photoluminescence emission wavelength of a quantum dot can have a sharp emission spectrum and exhibit a high quantum efficiency.

Quantum dots can have any suitable geometry such as, for example, rods, disks, prolate spheroids, and crystalline, polycrystalline, or amorphous nanoparticles that can convert light at a suitable wavelength or range of wavelengths, absorb selected wavelengths of light, and/or convert one form of energy into another.

Examples of quantum dot semiconductor materials include, for example, Groups II-VI, III-V, IV-VI semiconductor materials. Suitable quantum dot materials include CdS, CdSe, CdTe, ZnS, ZnSe, ZnTe, GaAs, GaP, GaAs, GaSb, HgS, HgSe, HgTe, InAs, InP, InSb, AlAs, AlP, and AlSb. Other examples of suitable quantum dot materials include InGaP, ZnSeTe, ZnCdS, ZnCdSe, and CdSeS. Multicore structures are also possible. Examples of multicore quantum dot configurations include a quantum dot having a semiconductor core material, a thin metal layer to protect the core from oxidation and to facilitate lattice matching, and a shell to enhance the luminescence properties. The core and shell layers can be formed from the same material, and may be formed, for example, from any of the listed semiconductor materials. A metal layer can comprise Zn or Cd. A core of a quantum dot can comprise a graded composition configured to distribute the lattice mismatch that normally occurs at the core-shell interface over a greater distance to improve performance and/or reliability of a quantum dot. For example, a quantum dot can comprise multiple shells for purposes of distributing core-shell lattice mismatch, and/or controlling the exciton confinement and/or electron-hole distribution, and/or to add a layer to improve environmental stability.

A quantum dot can have a diameter, for example, from 1 nm to 10 nm, such as from 1 nm to 8 nm, from 1 nm to 6 nm, from 1 nm to 5 nm, or from 2 nm to 4 nm.

A quantum dot can also comprise organic ligands and/or organic ligands bound to the surface of the quantum dot semiconductor core or to a coating surrounding a quantum dot semiconductor core. The ligands can be bound directly to the quantum dot or to a coating on the exterior surface of a quantum dot.

A quantum dot can comprise a ligand or combination of ligands. A ligand or combination of ligands can serve one or more purposes. For example, ligands can minimize agglomeration of quantum dots, provide a spacing between adjacent quantum dots, provide a protective exterior surface, and/or provide reactive functional groups capable of reacting with other constituents of a pixel.

A color conversion pixel can comprise a material that is transparent in the blue wavelength range such as $SiO_2$ or $Si_3N_4$.

Figure 3:
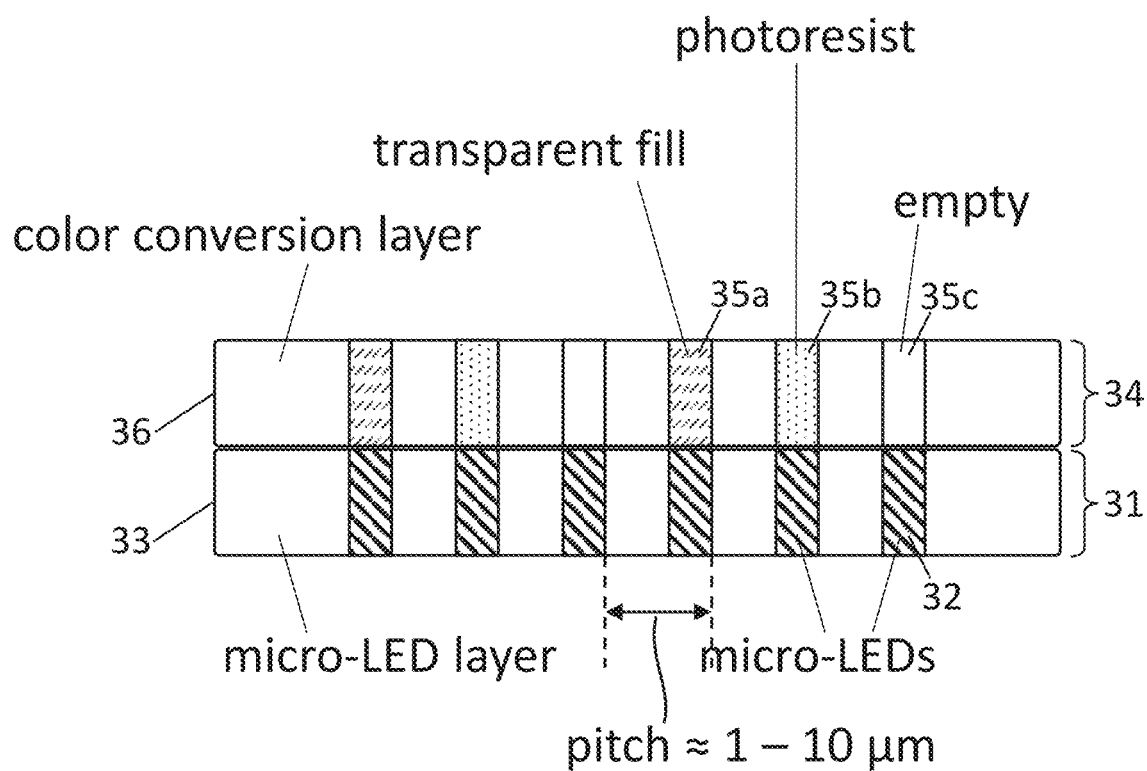
FIG. 3 shows a schematic, cross-sectional view of micro-LED and color conversion layers in a color, micro-LED display, with transparent fill, photoresist and empty, in a color conversion layer for blue, red and green pixels, respectively.

FIG. 3 shows a schematic, cross-sectional view of micro-LED layer 31 and a color conversion layer 34 of a color micro-LED display, with color-conversion pixels in substrate 36 having transparent fill 35a, having a photoresist 35b, or empty 35c. As described, color conversion pixels 35a/35b/35c can be configured to emit in the blue, red, and green wavelength ranges, respectively. Micro-LED layer includes micro-LEDs 32 in substrate 33.

The configuration shown in FIG. 3 can be obtained starting from the structure shown in FIG. 2 by performing three steps. First, all the cavities 25 in the color conversion layer 24 can be filled with a transparent fill such as $SiO_2$. Other transparent fill materials such as, for example, benzocyclobutene, or $Si_3N_4$ may also be used. Second, the transparent fill is removed from selected cavities leaving transparent fill in cavities 35a. For example, $SiO_2$ can be removed from two thirds of the cavities, leaving two out of every three cavities empty. Third, all of the cavities which are not filled with $SiO_2$ are filled with photoresist, and then the photoresist is removed from half of those cavities using photolithography techniques. The result, as illustrated in FIG. 3, is that one third of the cavities are filled with a transparent material 35a (e.g., $SiO_2$), one third of the cavities are filled with photoresist 35b, and the remaining one third of the cavities are empty 35c. Note that the second step (removing the transparent fill material from selected cavities) and the third step (removing photoresist from some of the cavities) require the use of state-of-the-art photolithography having spatial resolution finer than the pixel pitch. After the wafer is in the configuration shown in FIG. 3 state-of-the-art photolithography is no longer necessary. After the structure shown in FIG. 3 is fabricated, only blanket photoresist processing is needed to complete the color conversion layer. There is no need for equipment able to resolve individual pixels during processing after FIG. 3. After the structure shown in FIG. 3 is formed, the wafer can be removed from the facility equipped for state-of-the art photolithography. The subsequent steps, including removing photoresist from certain cavities and filling cavities with quantum dot-containing ink, can be done outside of a high-performance semiconductor manufacturing environment. For example, semiconductor process resolution on a length scale on the order of the pixel pitch. i.e., from 0.5 μm to 5 μm, is not required for filling the cavities with quantum dot-containing ink.

Figure 4:
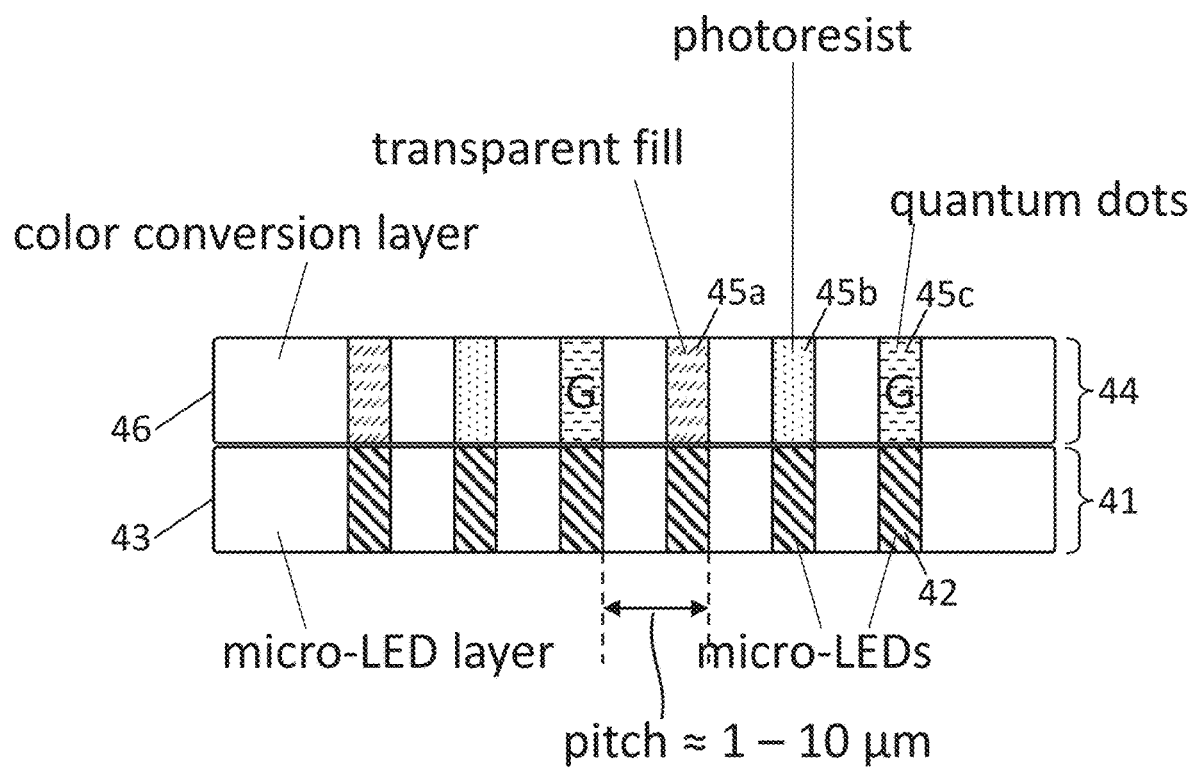
FIG. 4 shows the same view as FIG. 3, with green quantum dots in the color conversion layer for green pixels.

FIG. 4 shows the same view as in FIG. 3, with green quantum dots filling color conversion pixels 45c in the color conversion layer 44 corresponding to green pixels. FIG. 4 shows micro-LED layer 41 with micro-LEDs 42 in substrate 43; and color conversion layer 44 including pixels 45a containing a transparent fill, pixels 45b containing photoresist, and pixels 45c containing green-emitting quantum dots, in substrate 46. The green quantum dots may be deposited in the cavities while suspended in an ink using techniques such as those described in U.S. Application Publication No. 2020/0135988 A1 or using other methods. After the cavities 45c are filled with the quantum dot-containing ink, the quantum dot-containing ink may then be cured in place. The method for depositing the quantum dot-containing ink into the cavities does not depend on using selective photolithography. On the contrary, the quantum dot-containing ink may be applied to the entire wafer. The overburden, if any, such as excess quantum dot-containing ink overlying the color conversion layer, is then removed, leaving the cured quantum dot-containing ink in cavities 45c. After the quantum dot-containing ink is cured, or as part of the curing process, a cap may be formed over the quantum dot-containing ink. This step may also be performed without lithography by fabricating the cap from a material that does not bind to photoresist, or by making the ink such that the ink forms a polymer glass upon curing. Either way, a cap may be formed over the quantum-dot containing pixels, but not over the cavities filled with photoresist.

Figure 5:
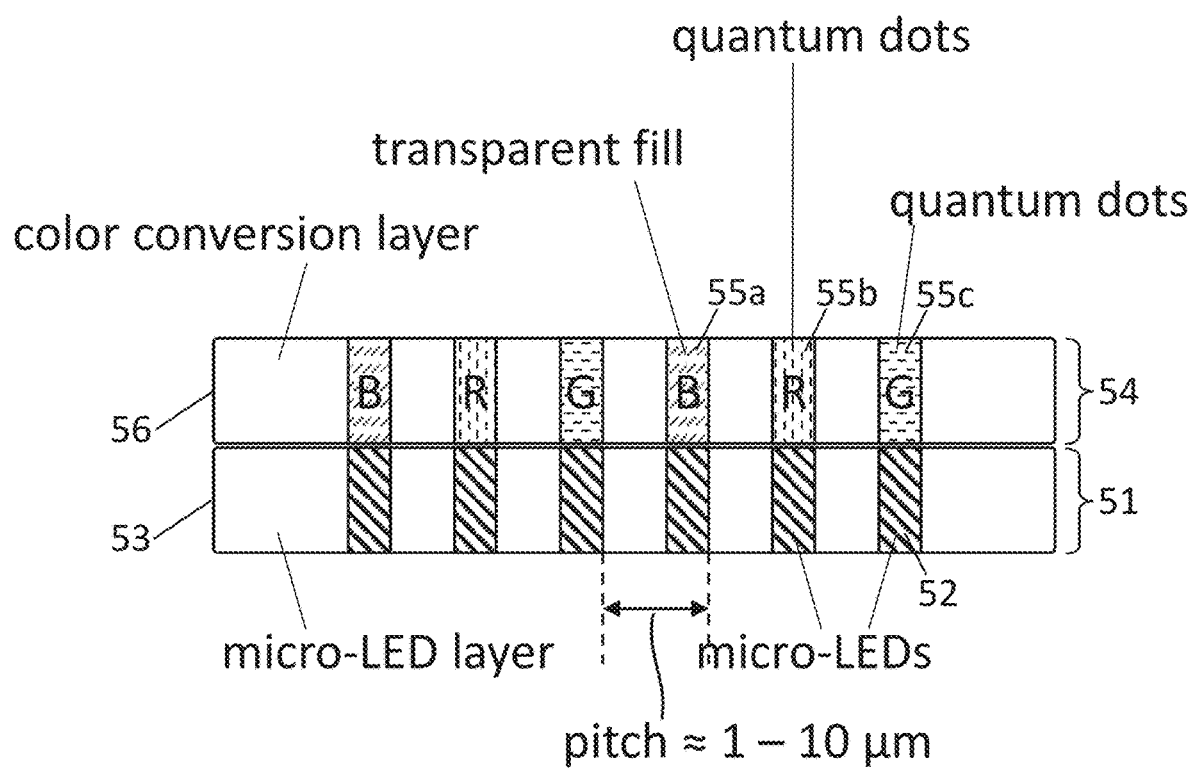
FIG. 5 shows the same view as FIG. 4, with red quantum dots in the color conversion layer for red pixels.

FIG. 5 shows the same view as in FIGS. 3 and 4, with red quantum dots in the color conversion layer corresponding to red pixels. FIG. 5 shows micro-LED layer 51 containing micro-LEDs 52 in substrate 53; and color conversion layer 54 including blue pixels 55a containing a transparent fill, red pixels 55b containing red-emitting quantum dots, and green pixels 55c containing green-emitting quantum dots, in substrate 56. To obtain this structure the photoresist in cavities 45b in FIG. 4 may be removed. The cavities can then be filled with a red quantum dot-containing ink as described for fabricating the green-emitting pixels. A "red" or "green" quantum dot is one that emits red or green light, as the case may be, when illuminated with a shorter wavelength light, such as blue light. In the process described above, one could exchange the order of fabricating the red and green pixels. The red, green and blue pixels can be adjacent to each other. For example, the pixels can be disposed in a regular square array. For example, the red, green and blue pixels can form a unit cell comprising one green-emitting color conversion pixels, and one blue-emitting color conversion pixel, such as shown in FIG. 9.

The structure shown in FIG. 5 (plus CMOS driver and optional optical layers, not shown in FIG. 5) is a monolithic, full-color, micro-LED display, capable of emitting in the blue, red, and green wavelength ranges. The semiconductor fabrication techniques described above are suitable for making even the smallest pixels at the finest pitches currently envisioned, for example, pixels with diameters as small as 0.5 μm to 5 μm on pitches ranging from 1 μm to 5 μm. Furthermore, quantum dots are introduced into the process only after the wafer (i.e. the CMOS, micro-LED, color conversion substrate stack) has left the high-resolution semiconductor processing facility in which the steps to define pixels in the micro-LED layer are performed. That high-resolution semiconductor fabrication facility cannot be contaminated by quantum dots. A high-resolution semiconductor fabrication facility refers to a facility capable of semiconductor processing at resolutions finer than the pitch of the cavities such as, for example at a pitch less than 10 μm or less than 5 μm. After the structure leaves the micro-LED processing facility, there is no further need for high-resolution (i.e. smaller than 10 μm) photolithography.

Figure 6:
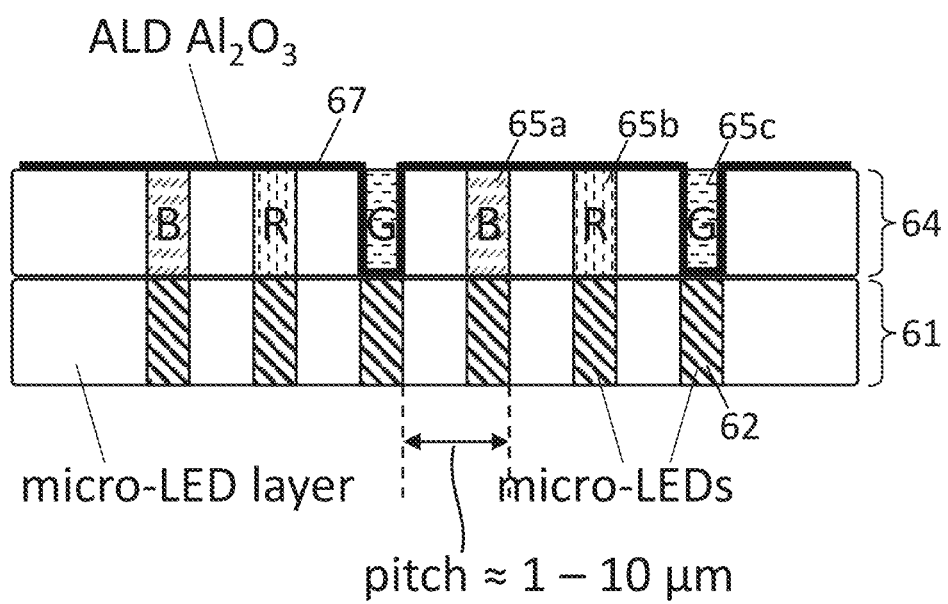
FIG. 6 shows micro-LED and color conversion layers in which the color conversion layer comprises blue, red, and green pixels and an $Al_2O_3$ passivation layer overlying the blue and red pixels and disposed on the sidewalls of the green pixels.

FIG. 6 shows a structure similar to that shown in FIG. 5 except that a passivation layer such as an $Al_2O_3$ layer 67 seals the red quantum dot pixels 65b and the transparent layer of the blue pixels 65a. FIG. 6 shows micro-LED layer 61 including micro-LEDs 62, and overlying color conversion layer 64 including blue 65a, red 65b, and green 65c color conversion pixels. Atomic layer deposition can be used to deposit the $Al_2O_3$ layer 67 after the red quantum dot pixels 65b are formed and before the green quantum dot-containing ink is deposited to form the green pixels 65c. The thickness of the $Al_2O_3$ layer can be, for example, within a range from 10 nm to 100 nm. Note that the green-emitting pixels can be formed before the red-emitting pixels, the $Al_2O_3$ layer deposited overlying the green-emitting pixels and overlying the blue pixels, and then the red-emitting pixels formed by depositing red quantum dot-containing ink within the cavities.

A color conversion layer provided by the present disclosure can comprise a first plurality of color conversion pixels configured to emit light in a first wavelength range and comprising a first plurality of quantum dots: a second plurality of color conversion-pixels configured to emit light in a second wavelength range and comprising a second plurality of quantum dots; and a third plurality of color conversion pixels configured to emit light in a third wavelength range comprising a transparent fill material: wherein each first color conversion pixel is adjacent to a second color conversion pixel and to a third color conversion pixel: the first wavelength range, the second wavelength range, and the third wavelength range are different wavelength ranges: each of the color conversion pixels independently has a diameter from 0.5 µm to 5 µm; and each of the color conversion pixels independently has a height/diameter ratio greater than 1.

Each of the color conversion pixels can have the same diameter and/or the same height/diameter ratio. The gap distance between adjacent color conversion pixels can be less than 5 µm.

A gap distance between adjacent color conversion pixels can be less than the diameter of the adjacent color conversion pixels and/or less than 5 µm.

Color conversion pixels can have a pitch from 0.5 µm to 5 µm, such as from 0.5 µm to 3 µm. A gap distance can be less than half the pitch.

Color conversion pixels are configured in an array wherein the gap distance between adjacent color conversion pixels is less than the pitch; and the color-conversion pixels are disposed on a pitch from 0.5 µm to 5 µm.

Color conversion pixels can have, for example, a diameter is from 0.5 µm to 1.5 µm; and a height/diameter ratio from 2 to 5.

Adjacent color conversion pixels can have, for example, a diameter from 0.5 µm to 1.5 µm; a height/diameter ratio from 2 to 5; a gap distance is less than the pitch; and a pitch from 0.6 µm to 5 µm.

The first plurality of color conversion pixels, the second plurality of color conversion pixels, and the third plurality of color conversion pixels can emit in different wavelength ranges. For example, the color conversion pixels can emit in the blue, the red and the green wavelength ranges. The different wavelength ranges can be characterized, for example, by a different center emission wavelength, having a center emission wavelength outside the full-width-half-maximum (FWHM) wavelength range of other groups of color conversion pixels, and/or having a FWHM that does not overlap with a FWHM of other groups of color conversion pixels.

The color conversion pixels are arranged in a regular square array or any other suitable pattern or array.

An electronic device can comprise a color conversion layer or a display comprising a color conversion layer provided by the present disclosure.

A process for making a color conversion layer can comprise, for example, (a) filling a third plurality of cavities with a transparent material to form a third plurality of color conversion pixels: (b) filling a second plurality of cavities with a photoresist: (c) filling a first plurality of cavities with a first plurality of quantum dots to form a first plurality of color conversion pixels: (d) removing the photoresist from the second plurality of cavities; and (e) filling the second plurality of cavities with a second plurality of quantum dots to form a second plurality of color conversion pixels, wherein steps (a) and (b) are performed in a high-resolution semiconductor fabrication environment; and steps (c)-(e) are not performed in a high-resolution semiconductor fabrication environment.

Steps (b)-(d) can be performed using semiconductor fabrication methods having a spatial resolution finer than a pitch between adjacent pixels.

A color conversion layer can comprise a substrate comprising the first plurality of cavities, the second plurality of cavities, and the third plurality of cavities, and after step (a) the color conversion layer can be removed from a high-resolution semiconductor fabrication environment.

Before step (a), a color conversion layer comprising a plurality of cavities can be fabricated in, for example, an aluminum substrate.

Before step (a), the color conversion substrate can be bonded to a micro-LED layer; and a plurality of cavities can be fabricated in the color conversion substrate.

Bonding a color conversion substrate to a micro-LED layer can comprise aligning each of the plurality of cavities with a respective micro-LED.

The process can comprise, after step (e), depositing a passivation layer overlying the color conversion layer. After depositing the passivation layer, an optical layer can be deposited overlying the passivation layer.

A process for making a color conversion layer can comprise, for example, (a) filling a third plurality of cavities with a transparent material in the blue wavelength range to form a third plurality of color conversion pixels: (b) filling a first plurality of cavities with a first plurality of quantum dots to form a first plurality of color conversion pixels: (c) depositing a first passivation layer overlying the first plurality of color conversion pixels, overlying the third plurality of color conversion pixels, and within a second plurality of cavities; and (d) filling the second plurality of cavities with the second plurality of quantum dots to form a second plurality of color conversion pixels, wherein step (a) is performed in a high-resolution semiconductor fabrication environment; and steps (b)-(d) are not performed in a high-resolution semiconductor fabrication environment.

Steps (b)-(d) can be performed using semiconductor fabrication methods having a spatial resolution finer than a pitch between adjacent pixels.

After step (a) the color conversion layer can be removed from a high-resolution semiconductor fabrication environment.

EXAMPLES

Embodiments provided by the present disclosure are further illustrated by reference to the following examples, which describe structures and methods provided by the present disclosure. It will be apparent to those skilled in the art that many modifications, both to materials, and methods, may be practiced without departing from the scope of the disclosure.

Example 1

Figure 7:
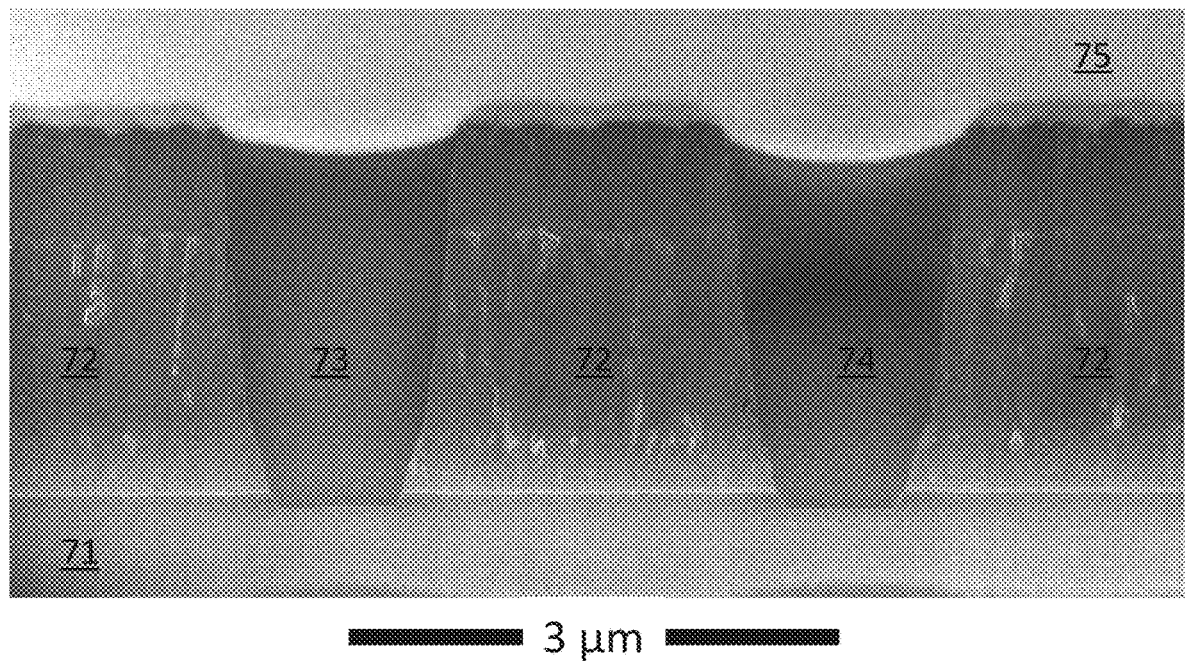
FIG. 7 is a scanning electron microscope (SEM) image showing a cross-sectional view of a color conversion layer comprising pixels filled with quantum dots.

FIG. 7 is an SEM image showing a cross-sectional view of an example of color conversion pixels overlying a glass substrate 71. Color conversion layer includes pixels 73 and 74 in an aluminum substrate 72. Pixel 73 comprises cavities filled with red-emitting quantum dots and pixel 74 comprises cavities filled with green quantum dots. A red-emitting quantum dot-containing ink was applied to the color conversion layer to fabricate a plurality of red-emitting pixels, and a green-emitting quantum dot-containing ink was applied to the color conversion layer to fabricate a plurality of green-emitting pixels. The color conversion layer 74 overlies a micro-LED layer that can include, for example, GaN-based quantum well micro-LEDs. A 3 µm scale is shown in the figure. The pixels have a diameter of about 1.3 µm and a depth of about 3 µm on a pitch of about 3.0 µm. The height/diameter ratio of the quantum dot pixels is about 2.3. Note that platinum layer 75 is a byproduct of the cross-sectioning process and is not part of the final structure.

Example 2

Figure 8:
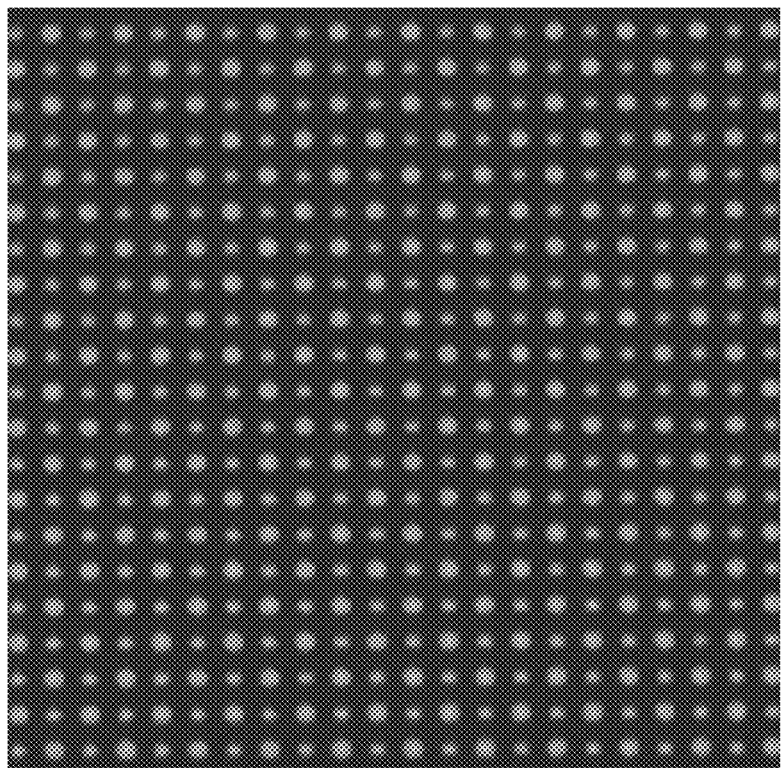
FIG. 8 is a photograph showing a plan view of a color conversion layer provided by the present disclosure comprising an array of red (large diameter) and green (small diameter) pixels.

FIG. 8 is a photograph showing a top view of a color conversion layer having an array of alternating red and green quantum dot-containing pixels. A cross-sectional SEM image of the structure is shown in FIG. 7. To fabricate the array, cavities having a diameter of about 1.3 μm and a depth of about 3 μm on a pitch of about 3 μm were etched into an aluminum substrate. The height/diameter ratio of the pixels is about 2.3. The cavities were then filled with a photoresist and the photoresist selectively removed from alternating cavities using photolithography techniques. A red quantum dot-containing ink was then applied over the wafer to fill a first plurality of cavities. The remaining photoresist was then removed to expose the remaining cavities which were filled with a green quantum dot-containing ink. Excess ink overlying the red and green pixels was removed after mechanically removing the excess ink using a blast of dry ice. The color conversion layer comprising the red- and green-emitting pixels was illuminated with blue light source to cause the red and green pixels to emit in the corresponding wavelength range.

Example 3

FIG. 9 is a photograph of a top view of an example of a three-color color conversion layer emitting in the blue, red, and green wavelength ranges as provided by the present disclosure. The display was fabricated as described in Example 2 except that a first plurality of cavities contains a material that is transparent in the blue wavelength range. A second plurality of cavities contains red-emitting quantum dots and a third plurality of cavities contains green-emitting quantum dots. The color conversion pixels have a diameter of about 1.3 μm on a pitch of about 3.0 μm and have depth of about 3 μm corresponding to a height/diameter ratio of about 2.3. The display was backlit with a blue light source to provide a three-color micro-display.

What is claimed is:

1. A color conversion layer comprising:
 a first plurality of color conversion pixels configured to emit light in a first wavelength range and comprising a first plurality of quantum dots;
 a second plurality of color conversion pixels configured to emit light in a second wavelength range and comprising a second plurality of quantum dots; and
 a third plurality of color conversion pixels configured to emit light in a third wavelength range comprising a transparent fill material; wherein,
  each first color conversion pixel is adjacent to a second color conversion pixel and to a third color conversion pixel;
  the first wavelength range, the second wavelength range, and the third wavelength range are different wavelength ranges;
  each of the color conversion pixels independently has a diameter from 0.5 μm to 5 μm;
  each of the color conversion pixels independently has a height/diameter ratio greater than 1; and
  the color conversion pixels are configured in an array wherein,
   the color conversion pixels are disposed on a pitch from 0.5 μm to 5 μm; and
   a gap distance between adjacent color conversion pixels is less than the pitch.

2. The color conversion layer of claim 1, wherein each of the color conversion pixels has a same diameter.

3. The color conversion layer of claim 1, wherein each of the color conversion pixels has a same height/diameter ratio.

4. The color conversion layer of claim 1, wherein the gap distance between the adjacent color conversion pixels is less than the diameter of the adjacent color conversion pixels.

5. The color conversion layer of claim 1, wherein the gap distance between the adjacent color conversion pixels is less than 5 μm.

6. The color conversion layer of claim 1, wherein a pitch of the adjacent color conversion pixels is from 0.5 μm to 5 μm.

7. The color conversion layer of claim 6, wherein the gap distance between the adjacent color conversion pixels is from 0.5 μm to 3 μm.

8. The color conversion layer of claim 6, wherein the gap distance between the adjacent color conversion pixels is less than half the pitch.

9. The color conversion layer of claim 1, wherein,
 the diameter is from 0.5 μm to 1.5 μm; and
 the height/diameter ratio is from 2 to 5.

10. The color conversion layer of claim 9, wherein the adjacent color conversion pixels have:
 a pitch from 0.6 μm to 5 μm; and
 the gap distance is less than the pitch.

11. The color conversion layer of claim 1, wherein the transparent fill material is transparent in a blue wavelength range.

12. The color conversion layer of claim 1, wherein the first wavelength range comprises a red wavelength range.

13. The color conversion layer of claim 1, wherein the second wavelength range comprises a green wavelength range.

14. The color conversion layer of claim 1, wherein the color conversion pixels are arranged in a regular square array.

15. The color conversion layer of claim 14, wherein,
 the first plurality of color conversion pixels comprise red-emitting pixels;
 the second plurality of color conversion pixels comprise green-emitting pixels;
 the third plurality of color conversion pixels comprise blue-emitting pixels; and
 each of the first plurality of color conversion pixels is adjacent to two of the second plurality of color conversion pixels and to two of the third plurality of color conversion pixels.

16. The color conversion layer of claim 14, wherein a unit cell of the regular square array comprises two red-emitting color conversion pixels, one green-emitting color conversion pixel, and one blue-emitting color conversion pixel.

17. The color conversion layer of claim 1, comprising a first passivation layer overlying the first plurality of color conversion pixels, the third plurality of color conversion pixels, and sidewalls of the second plurality of color conversion pixels.

18. The color conversion layer of claim 17, wherein the first passivation layer comprises $Al_2O_3$.

19. The color conversion layer of claim 17, wherein the first passivation layer has a thickness from 10 nm to 100 nm.

20. The color conversion layer of claim 1, comprising an optical layer overlying the color conversion layer.

21. The color conversion layer of claim 20, wherein the optical layer comprises a plurality of micro-lenses independently configured to focus light emitted by a plurality of color conversion pixels.

22. A monolithic, multi-color, micro-light-emitting diode (micro-LED) display comprising the color conversion layer of claim 1.

23. The display of claim 22, comprising a micro-LED layer bonded to the color conversion layer.

24. The display of claim 23 wherein,
   the micro-LED layer comprises a plurality of micro-LEDs; and
   each of the color conversion pixels overlies a respective micro-LED.

25. The display of claim 24, wherein each of the micro-LEDs has a same structure.

26. The display of claim 24, wherein each of the micro-LEDs is selected from a GaN quantum well micro-LED, an InGaN-based quantum well micro-LED, and an InAlGaN quantum well micro-LED.

27. The display of claim 23, comprising a complementary metal oxide semiconductor driver layer bonded to the micro-LED layer.

28. An electronic device comprising the display of claim 22.

29. An electronic device comprising the color conversion layer of claim 1.

* * * * *